US007667503B2

(12) United States Patent
Kadowaki

(10) Patent No.: US 7,667,503 B2
(45) Date of Patent: Feb. 23, 2010

(54) SEMICONDUCTOR SWITCHING CIRCUIT WITH HYSTERESIS

(75) Inventor: Hirokazu Kadowaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 12/042,032

(22) Filed: Mar. 4, 2008

(65) Prior Publication Data

US 2008/0218243 A1    Sep. 11, 2008

(30) Foreign Application Priority Data

Mar. 6, 2007    (JP) .............................. 2007-056406

(51) Int. Cl.
*H03B 1/00*    (2006.01)
(52) U.S. Cl. ............................ 327/109; 326/84; 326/89
(58) Field of Classification Search ............. 326/82–84, 326/89; 327/108, 109
See application file for complete search history.

(56) References Cited

U.S. PATENT DOCUMENTS

| | | | | |
|---|---|---|---|---|
| 3,512,010 | A * | 5/1970 | Washburn | 327/205 |
| 3,612,904 | A * | 10/1971 | Moe | 327/460 |
| 7,535,283 | B2 * | 5/2009 | Kojima | 327/538 |
| 7,570,085 | B2 * | 8/2009 | Ishikawa et al. | 327/108 |

FOREIGN PATENT DOCUMENTS

JP    10-022803    1/1998

OTHER PUBLICATIONS

Data Sheet "Quad Line Receivers MC 1489, MC 1489A"; STMicroelectronics; Sep. 2003.

* cited by examiner

*Primary Examiner*—Lincoln Donovan
*Assistant Examiner*—William Hernandez
(74) *Attorney, Agent, or Firm*—Turocy & Watson, LLP

(57) ABSTRACT

There is provided a switching circuit including, a semiconductor switching circuit comprising, a transistor, a first electrode of the transistor being connected to an electrical source via a load, a second electrode of the transistor being connected to a standard potential, a driving circuit outputting a signal to a control electrode of the transistor on a basis of a potential in the first electrode of the transistor so as to turn on and off the transistor, the driving circuit turning on when an input voltage applied from an input terminal being a first voltage higher than a threshold voltage of the transistor, the driving circuit turning off when the input voltage being a second voltage lower than the threshold voltage of the transistor.

17 Claims, 8 Drawing Sheets

SEMICONDUCTOR SWITCHING CIRCUIT WITH HYSTERESIS

CROSS REFERENCE TO RELATED APPLICATION

This application is based upon and claims the benefit of priority from the prior Japanese Application No. 2007-56406, filed Mar. 6, 2007, the entire contents of which are incorporated herein by reference.

FIELD OF THE INVENTION

The present invention relates to a semiconductor switching circuit and a semiconductor integrated-device including the semiconductor switching circuit.

DESCRIPTION OF THE BACKGROUND

A driving circuit having a function of precisely turning on and off a MOS transistor in a ground potential difference has been well known and is disclosed, for example, in Japanese Patent Publication (Kokai) No. H10-22803.

The driving circuit disclosed in Japanese Patent Publication (Kokai) No. H10-22803 is constituted with an npn-transistor and a resistor. The driving circuit turns on and off the MOS transistor corresponding to a voltage of an input terminal grounded and opened by a switching element located in a control circuit side.

The voltage of the input terminal for turning on the MOS transistor is set on high by changing a resistance. Accordingly, the MOS transistor is precisely turned even when the ground potential in the control circuit side becomes higher than ground potential in the driving circuit side.

However, the driving circuit disclosed in Japanese Patent Publication (Kokai) No. H10-22803 merely has the same input voltage at both turning on and turning off of the MOS transistor and fails to disclose hysteresis characteristics.

SUMMARY OF INVENTION

According to an aspect of the invention, there is provided a switching circuit including, a semiconductor switching circuit comprising, a transistor, a first electrode of the transistor being connected to an electrical source via a load, a second electrode of the transistor being connected to a standard potential, and a driving circuit outputting a signal to a control electrode of the transistor on a basis of a potential in the first electrode of the transistor so as to turn on and off the transistor, the driving circuit turning on when an input voltage applied from an input terminal is a first voltage higher than a threshold voltage of the transistor, the driving circuit turning off when the input voltage is a second voltage lower than the threshold voltage of the transistor.

Further, according to another aspect of the invention, there is provided a switching circuit including, a semiconductor switching circuit comprising, a transistor, a first electrode of the transistor being connected to a standard potential via a load, a second electrode of the transistor being connected to an electrical source, and a driving circuit outputting a signal to a control electrode of the transistor on a basis of a potential in the first electrode of the transistor so as to turn on and off the transistor, the driving circuit turning off when an input voltage applied from an input terminal is a first voltage higher than a threshold voltage of the transistor, the driving circuit turning from on when the input voltage is a second voltage lower than the threshold voltage of the transistor.

Further, according to another aspect of the invention, there is provided a switching circuit including, a semiconductor integrated-device comprising, a semiconductor substrate, a semiconductor switching circuit formed on the semiconductor substrate, the semiconductor switching circuit including, a transistor, a first electrode of the transistor being connected to a electrical source via a load, a second electrode of the transistor being connected to a standard potential, a driving circuit outputting a signal to a control electrode of the transistor on a basis of a potential in the first electrode of the transistor so as to turn on and off the transistor, the driving circuit turning on when an input voltage applied from input terminal is a first voltage higher than a threshold voltage of the transistor, the driving circuit turning off when the input voltage is a second voltage lower than the threshold voltage of the transistor, and a bonding pad being connected to an input-terminal and an output-terminal of the semiconductor switching circuit, the bonding pad supplying an input received from an outer portion as an input voltage to the switching circuit, the bonding pad supplying an output voltage from the semiconductor switching circuit to the outer portion.

DETAILED DESCRIPTION OF THE INVENTION

Figure 1:
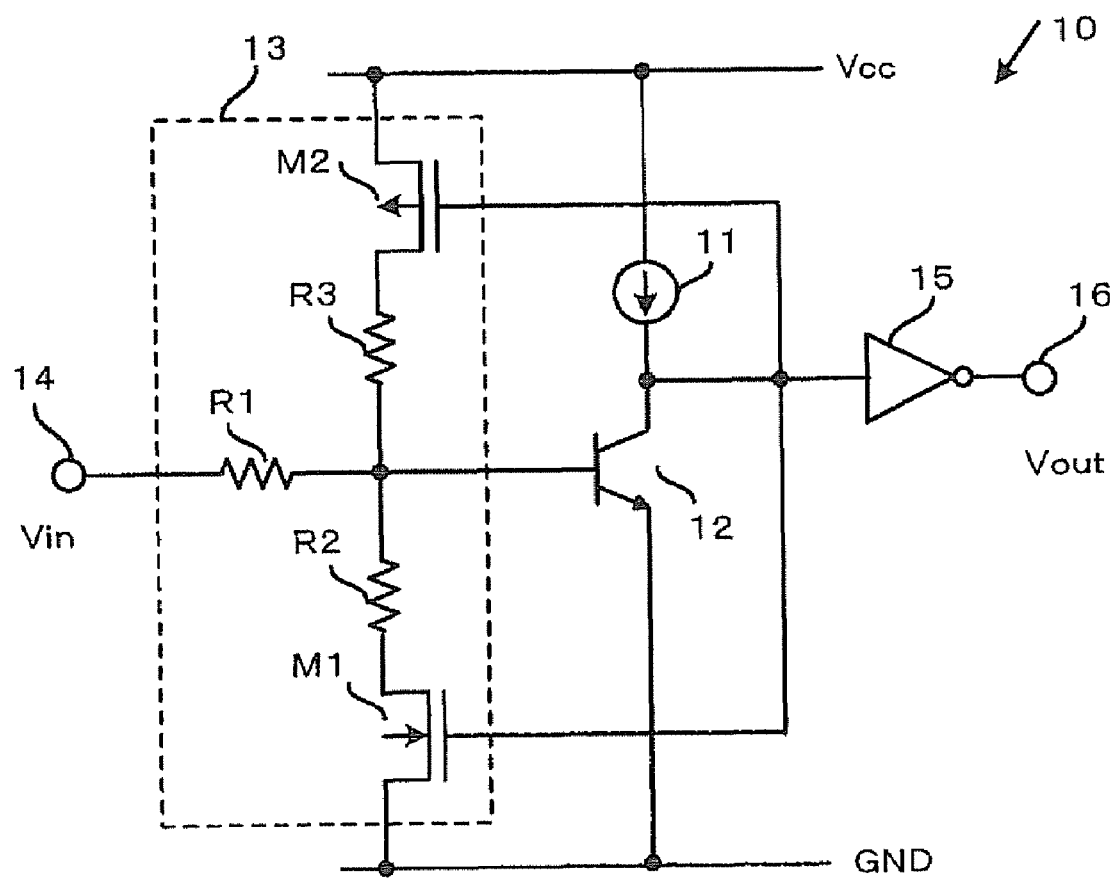
FIG. 1 is a circuit diagram showing a switching circuit in a first embodiment of the present invention.

Embodiments of the present invention will be described below in detail with reference to the attached drawings. It should be noted that the present invention is not restricted to the embodiments but covers their equivalents. Throughout the attached drawings, similar or same reference numerals show similar, equivalent or same components.

First Embodiment

Figure 2:
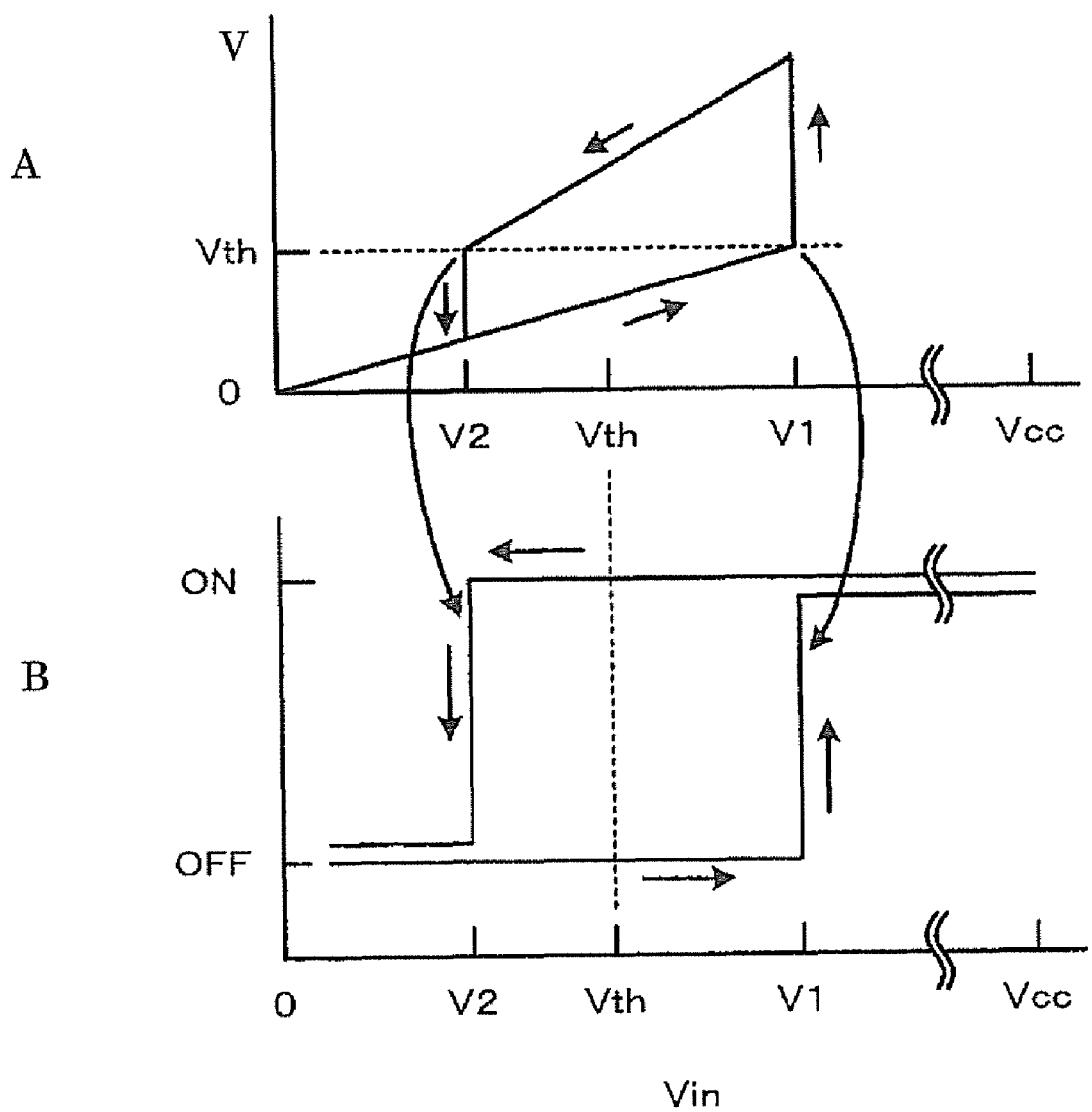
FIGS. 2A and 2B show input-output characteristic diagrams of the switching circuit, respectively, in the first embodiment of the present invention.

First, a switching circuit according to a first embodiment of the present invention will be described below in detail with reference to FIG. 1 and FIG. 2. FIG. 1 is a circuit diagram showing a switching circuit in the first embodiment of the present invention. FIGS. 2A and 2B show input-output characteristic diagrams of the switching circuit in the first embodiment of the present invention.

As shown in FIG. 1, a switching circuit 10 in this embodiment includes an npn-bipolar transistor being called as the transistor 12 hereafter and a driving circuit 13. The transistor 12 has a collector (first electrode) being connected to an electrical source Vcc via a constant current source (load) 11 and an emitter (second electrode) being connected to a standard potential GND. The driving circuit 13 turns on the transistor 12 at a first input voltage V1 higher than a threshold voltage Vth of the transistor 12 and turns off the transistor 12 at a second input voltage V2 lower than the threshold voltage Vth of the transistor 12.

The driving circuit 13 includes a first resistor R1, a second resistor R2, a third resistor R3, a first n-channel MOS transistor M1 being called the first transistor M1 hereafter, and a second p-channel MOS transistor M2 being called the second transistor M2 hereafter. The first resistor R1 is connected between an input terminal 14 and a base (control electrode) of the transistor 12. The drain as the first electrode of the first transistor M1 is connected to the base of the transistor 12 via the second resistor R2, the source as the second electrode of the first transistor M1 is connected to the standard potential GND, and a gate as a control electrode of the first transistor M1 is connected to the collector of the transistor 12. A drain as the first electrode of the second transistor M2 is connected to the base of the transistor 12 via the third resistor R3, a source as the second electrode of the second transistor M2 is connected to the electrical source Vcc, and a gate as a control electrode of the second transistor M2 is connected to the collector of the transistor 12.

Further, the switching circuit 10 provides a switching output Vout, which is output from an output terminal 16 to an outer portion, via an inverter 15 being connected to the collector of the transistor 12 as a buffer.

As the collector of the transistor 12 becomes H-level being up to Vcc when the transistor 12 turns off, the first transistor M1 turns on and the second transistor M2 turns off.

Accordingly, the second resistor R2 is connected to the standard potential GND. On the other hand, the third resistor R3 is cut off from the electrical source Vcc to become a floating-state.

As the collector of the transistor 12 becomes L-level being down from the H-level when the transistor 12 turns on, the first transistor M1 turns off and the second transistor M2 turns on.

Accordingly, the second resistor R2 is cut off from the standard potential GND and further becomes floating-state. On the other hand, the third resistor R3 is connected to the electrical source Vcc.

Next, FIGS. 2A and 2B show input-output characteristic diagrams of the switching circuit, respectively, in the first embodiment of the present invention. FIG. 2A shows a relationship between an input voltage Vin and the base voltage of the transistor 12 and FIG. 2B shows a relationship between the input voltage Vin and on-off operations of the transistor 12.

As shown in FIGS. 2A, 2B, the switching circuit 10 includes hysteresis characteristics corresponding to the input voltage Vin being provided into the input terminal 14. The hysteresis characteristics show that the transistor 12 turns on at the first input voltage V1 higher than the threshold voltage Vth of the transistor 12 and turns off at the second input voltage V2 lower than the threshold voltage of the transistor 12.

When the input voltage Vin is equal to zero and the transistor 12 is the off-state, the collector voltage of the first transistor 12 is H-level being up to Vcc. Therefore, the first transistor M1 turns on and the second transistor M2 turns off.

According to the action mentioned above, the second resistor R2 is electrically connected to the first resistor R1, on the other hand, the third resistor R3 is electrically disconnected from the first resistor R1.

As a result, a voltage of Vin×R2/(R1+R2) is applied to the base of the transistor 12, where Vin is the input voltage Vin, R1 is the first resistance, and R2 is the second resistance.

Consequently, the transistor 12 retains the off-state in a case of the input voltage Vin being increased and being over the threshold voltage Vth.

When the input voltage Vin is further increased and reaches up to the first input voltage V1, where the base voltage of transistor 12 is equal to the threshold voltage Vth, namely V1×R2/(R1+R2) is equal to Vth, and the first transistor 12 turns on and the collector voltage becomes L-level. As a result, the first transistor M1 turns off and the second transistor M2 turns on.

According to the action mentioned above, the second resistor R2 is electrically disconnected from the first resistor R1, on the other hand, the third resistor R3 is electrically connected to the first resistor R1. A voltage being difference between the electrical source voltage Vcc and the voltage drop of the third resistor R3, namely Vcc−(Vcc−Vin)×R3/(R1+R3) is applied to the base of the transistor 12.

Consequently, the base voltage of the transistor 12 perpendicularly rises up to be applied a positive feedback. Therefore, the transistor 12 turns completely on to be stable.

Accordingly, when the input voltage Vin is decreased to be lower than the threshold voltage Vth of the transistor 12 retains the on-state.

When the input voltage Vin is further decreased and reaches to the second input voltage V2, where the base voltage of the transistor 12 is equal to the threshold voltage Vth, namely Vcc−(Vcc−V2)×R3/(R1+R3) is equal to Vth, the first transistor 12 turns off and the collector voltage becomes H-level Vcc. As a result, the first transistor M1 turns on and the second transistor M2 turns off.

According to the action mentioned above, the second resistor R2 is electrically connected to the first resistor R1, on the other hand, the third resistor R3 is electrically disconnected from the first resistor R1.

As a result, the base voltage of the transistor 12 perpendicularly drops down to be applied a positive feedback. Therefore, the transistor 12 turns completely off to be stable.

The switching circuit 10 can obtain the hysteresis characteristic in which the transistor 12 turns on at the first input voltage V1 higher than the threshold voltage Vth of the transistor 12 and turns off at the second input voltage V2 lower than the threshold voltage of the transistor 12.

The first input voltage V1 turning on the transistor 12 and the second input voltage V2 turning off the transistor 12 are represented by following formulas, where the second resistor R2 and the third resistor R3 includes on-resistances of the first transistor M1 and the second transistor M2, respectively.

$$V1 = Vth(1 + R1/R2) \tag{1}$$

$$V2 = Vth - (Vcc - Vth)R1/R3 \tag{2}$$

For example, as the threshold voltage Vth of the transistor 12 is 0.7V, the first input voltage V1 is approximately 1.4V being higher than the threshold voltage Vth when R1 is equal to R2. On the other hand, the second input voltage V2 is approximately 0.47V being lower than the threshold voltage Vth when Vcc is equal to 3V and a resistance ratio R3/R1 is equal to ten.

As mentioned above, as the switching circuit 10 in this embodiment includes the driving circuit 13 having the first resistor R1, the second resistor and the third R3, respectively, and the first transistor M1 and the second transistor M2 complimentary turning on and off, respectively, the switching circuit 10 can obtain the hysteresis characteristic in which the transistor 12 turns on at the first input voltage V1 higher than the threshold voltage Vth of the transistor 12 and turns off at the second input voltage V2 lower than the threshold voltage of the transistor 12.

Consequently, even when the electrical source voltage Vcc is lowered, the voltage difference between the first input voltage V1 and the second input voltage V2 is fully retained. Therefore, when the input voltage is instantaneously lowered by noise or the like, transistor 12 turns off to prevent the switching circuit 10 from malfunctioning. As a result, the switching circuit 10 having stable switching characteristics can be obtained.

Figure 3:
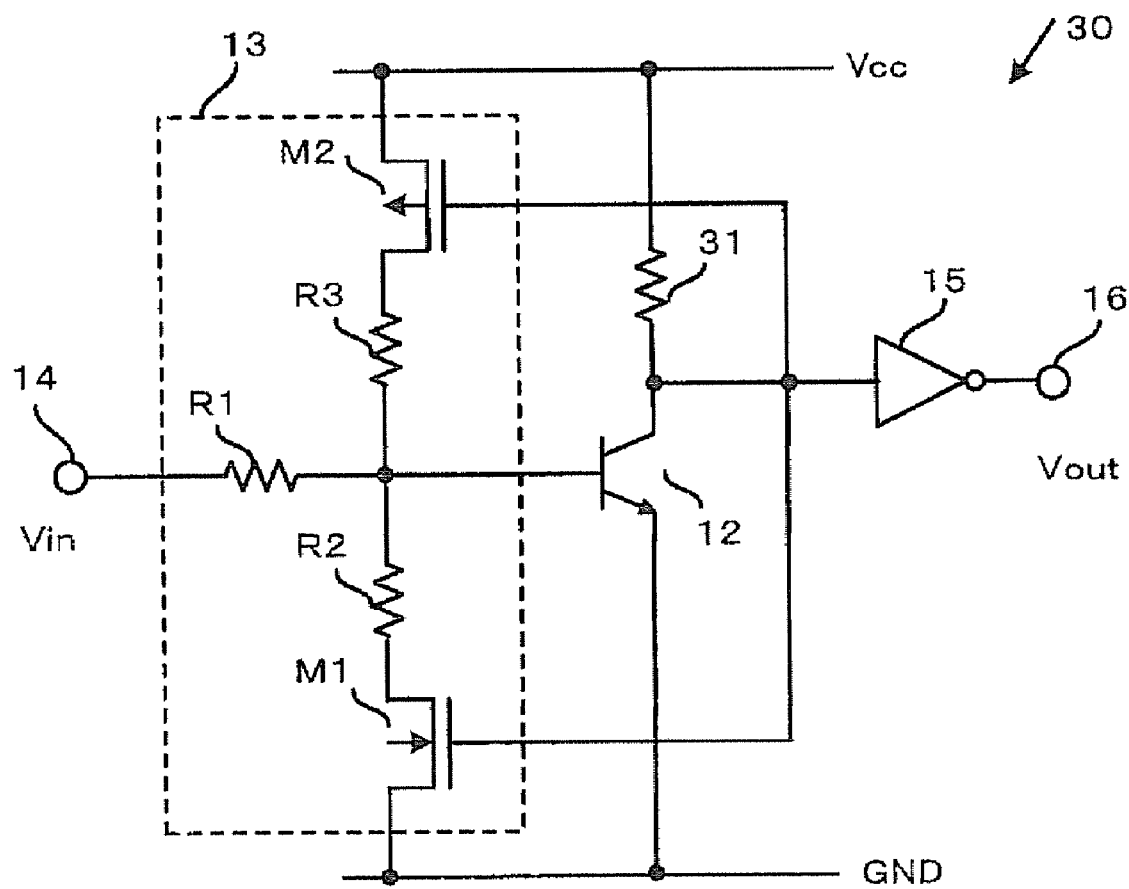
FIG. 3 is a circuit diagram showing a switching circuit in a first modification of the first embodiment of the present invention.

Here, it is explained on the load 11 being a constant current source as an active load in the first embodiment. However, the present invention is not restricted in the above case. For example, the load 11 may be a resistor load. FIG. 3 is a circuit diagram showing a switching circuit in a first modification of the first embodiment of the present invention. As shown in FIG. 3, a switching circuit 30 has a resistor 31 as the load of the transistor 12. The switching circuit 30 has an advantage to be constituted with a fewer elements as comparing with the case of the first embodiment using the load 11.

Figure 4:
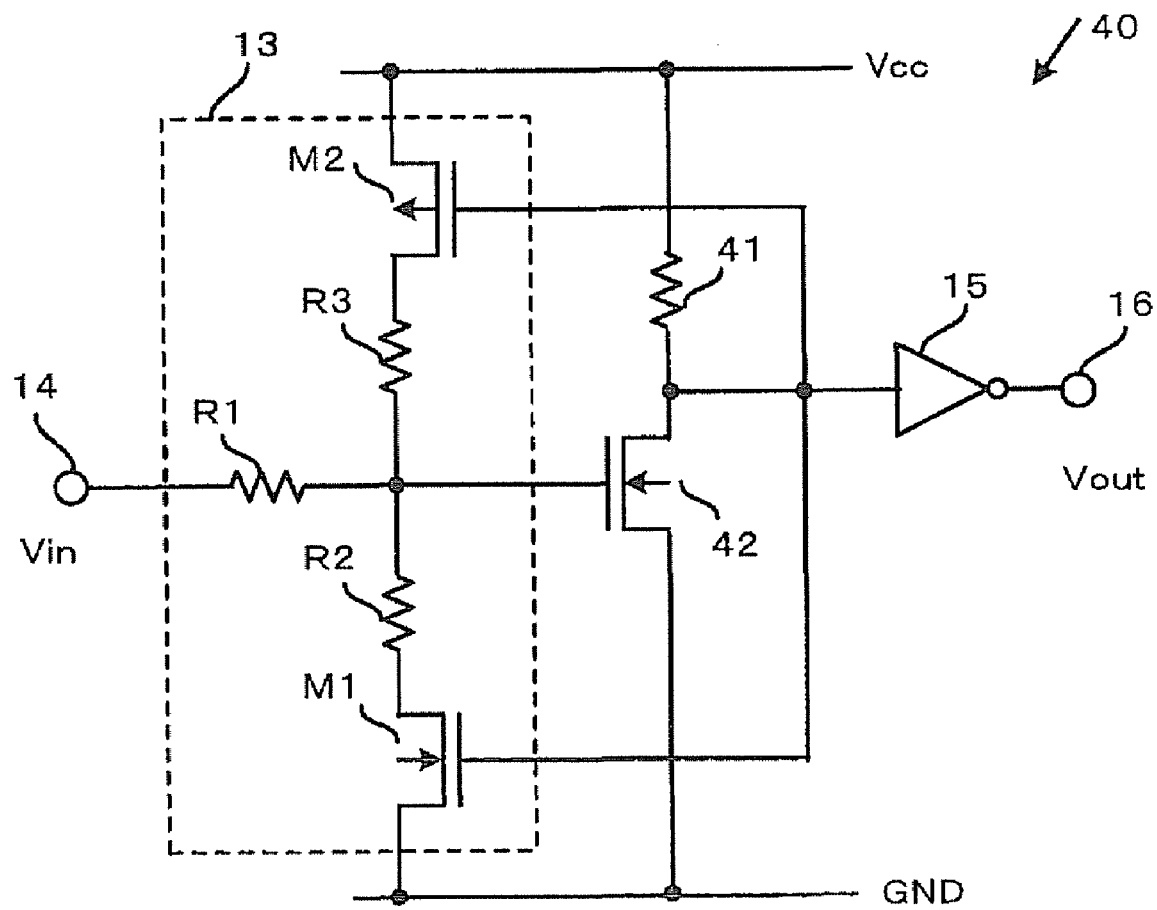
FIG. 4 is a circuit diagram showing a switching circuit in a second modification of the first embodiment of the present invention.

Furthermore, it is explained on the transistor 12 being the npn bipolar transistor in the first embodiment. However, the present invention is not restricted in the above case. For example, the transistor 12 may be an n-channel MOS transistor. FIG. 4 is a circuit diagram showing a switching circuit in a second modification of the first embodiment of the present invention. As shown in FIG. 4, a switching circuit 40 includes an n-channel MOS transistor 42 being connected to the electrical source Vcc via a resistor 41. As transistors in the switching circuit 40 are all MOS transistors, an advantage in this structure is that the switching circuit 40 being monolithically integrated on a same chip can be easily formed.

Figure 5:
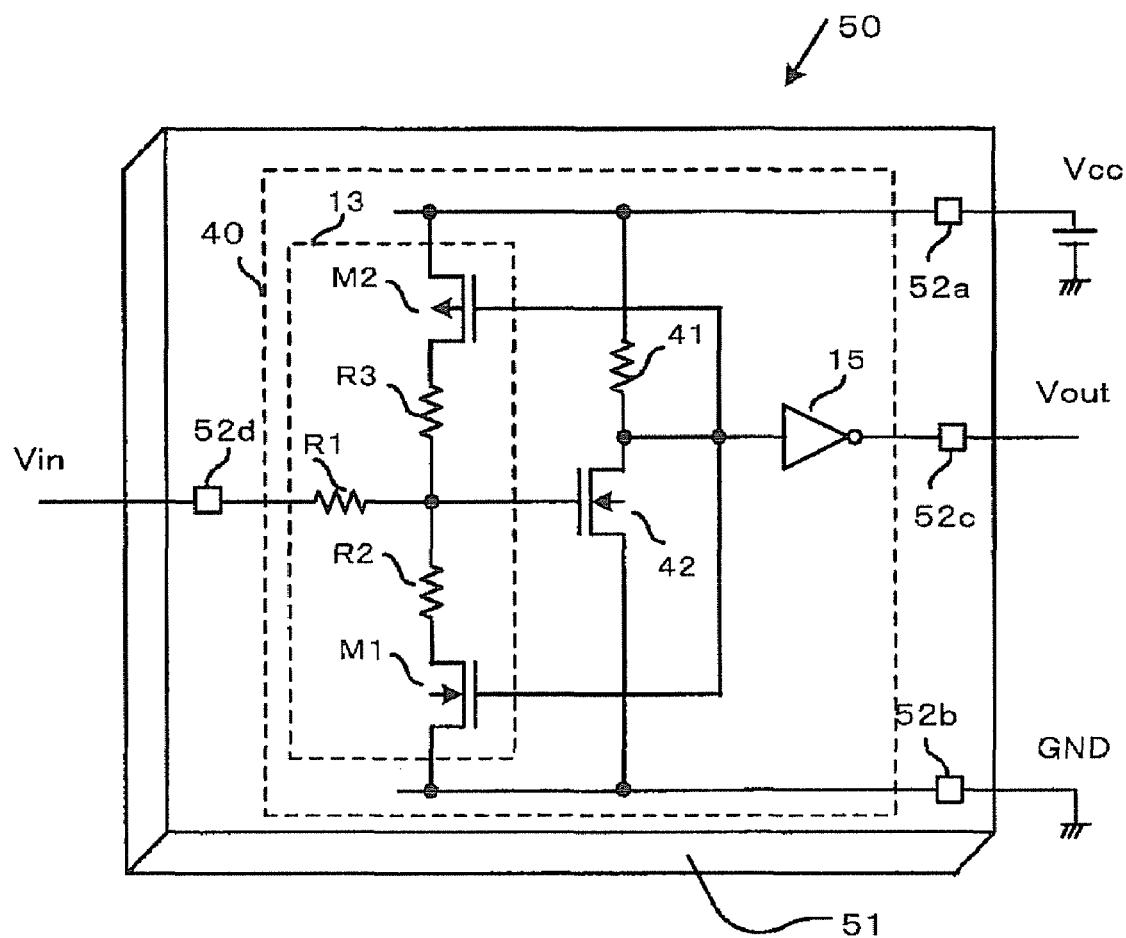
FIG. 5 is a circuit diagram showing a semiconductor integrated device including the switching circuit as shown in FIG. 4 in the second modification of the first embodiment of the present invention.

FIG. 5 is a circuit diagram showing a semiconductor integrated device including the switching circuit as shown in FIG. 4 in the second modification of the first embodiment of the present invention. As shown in FIG. 5 as the second modification of the first embodiment, the switching circuit 40 having the n-channel MOS transistor 42 and the driving circuit 13 is monolithically integrated on a same chip in a semiconductor integrated-device 50. The n-channel MOS transistor 42 is connected to the electrical source Vcc via the resistor 41 and the driving circuit 13 includes the first resistor R1, the second resistor R2, the third resistor R3, and the first transistor M1 and the second transistor M2 turning complimentary on and off, respectively. The first transistor M1, the second transistor M2 and the MOS transistor 42 can be formed, for example, by a well-known CMOS process.

Furthermore, bonding-pads 52a-52d are formed on the semiconductor chip to being provided with the input voltage Vin from an outer portion and providing with a switching output Vout to outer region.

Moreover, the MOS transistor 42 may be the bipolar transistor 12 in the semiconductor integrated-device 50.

It is explained the case that the first transistor M1 and the second transistor M2 are MOS transistors. However, the first transistor M1 and the second transistor M2 may be a switching element, respectively, for example, the bipolar transistor or a transmission gate having an n-MOS transistor and a p-MOS transistor being symmetrically connected each other.

Second Embodiment

Next, a switching circuit according to a second embodiment of the present invention will be described below in detail with reference to FIG. 6 being a circuit diagram showing a switching circuit.

Figure 6:
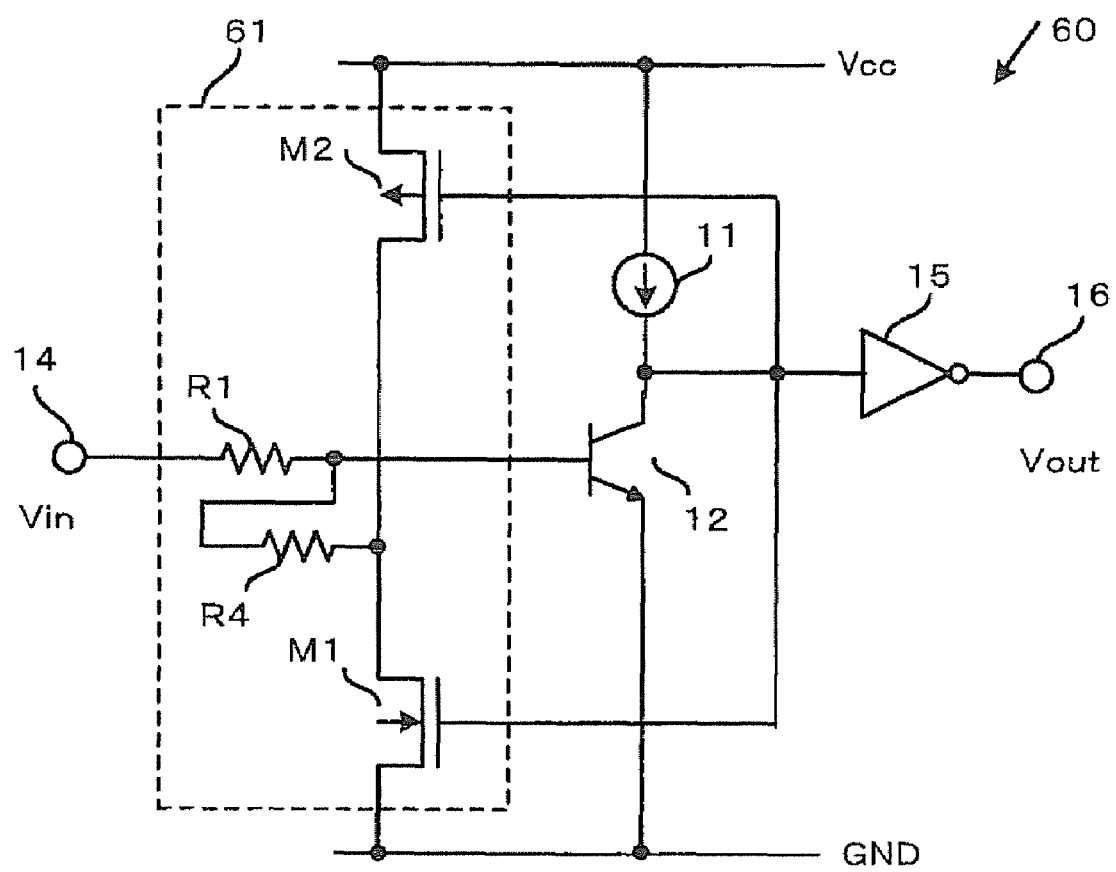
FIG. 6 is a circuit diagram showing a switching circuit in a second embodiment of the present invention.

In FIG. 6, a portion of a same composition as the first embodiment is attached the same number. Therefore, explanation on the same number in FIG. 6 of the second embodiment is omitted.

A difference point between the second embodiment and the first embodiment is to be unified the second resistor and the third resistor in the second embodiment.

As shown in FIG. 6, a driving circuit 61 of a switching circuit 60 in this embodiment includes the first transistor M1 and the second transistor M2. The drain of the first transistor M1 is connected to the base of the transistor 12 via the fourth resistor R4 and the drain of the second transistor M2 is connected to the base of the transistor 12 via the fourth resistor R4.

According to the structure mentioned above, the fourth resistor R4 is electrically connected to the standard potential GND when the first transistor M1 turns on and the second transistor M2 turns off, so that the fourth resistor R4 can act as the same as the second resistor R2. On the other hand, the fourth resistor R4 is electrically connected to the electrical source Vcc when the first transistor M1 turns off and the second transistor M2 turns on, so that the fourth resistor R4 can act as the same as the third resistor R3.

As a result, the first input voltage V1 and the second input voltage V2 are represented by following formulas.

$$V1 = Vth(1 + R1/R4) \quad (3)$$

$$V2 = Vth - (Vcc - Vth)R1/R4 \quad (4)$$

For example, as the threshold voltage Vth of the transistor 12 is 0.7V, the first input voltage V1 is approximately 1.05V being higher than the threshold voltage Vth when R4/R1 is equal to two. On the other hand, the second input voltage V2 is approximately 0.3V being lower than the threshold voltage Vth when Vcc is equal to 1.5V.

As mentioned above, the driving circuit 61 of the switching circuit 60 in this embodiment includes the fourth resistor R4 having functions of the second resistor R2 and the third resistor. As a result, an advantage of reducing a number of the element in the switching circuit 60 is produced.

In the second embodiment, it is explained a transistor for switching is the npn-bipolar transistor 12 or n-channel MOS transistor 42, however, the present invention is not restricted to the above case. The pnp-bipolar transistor or a p-channel MOS transistor may be available.

Figure 7:
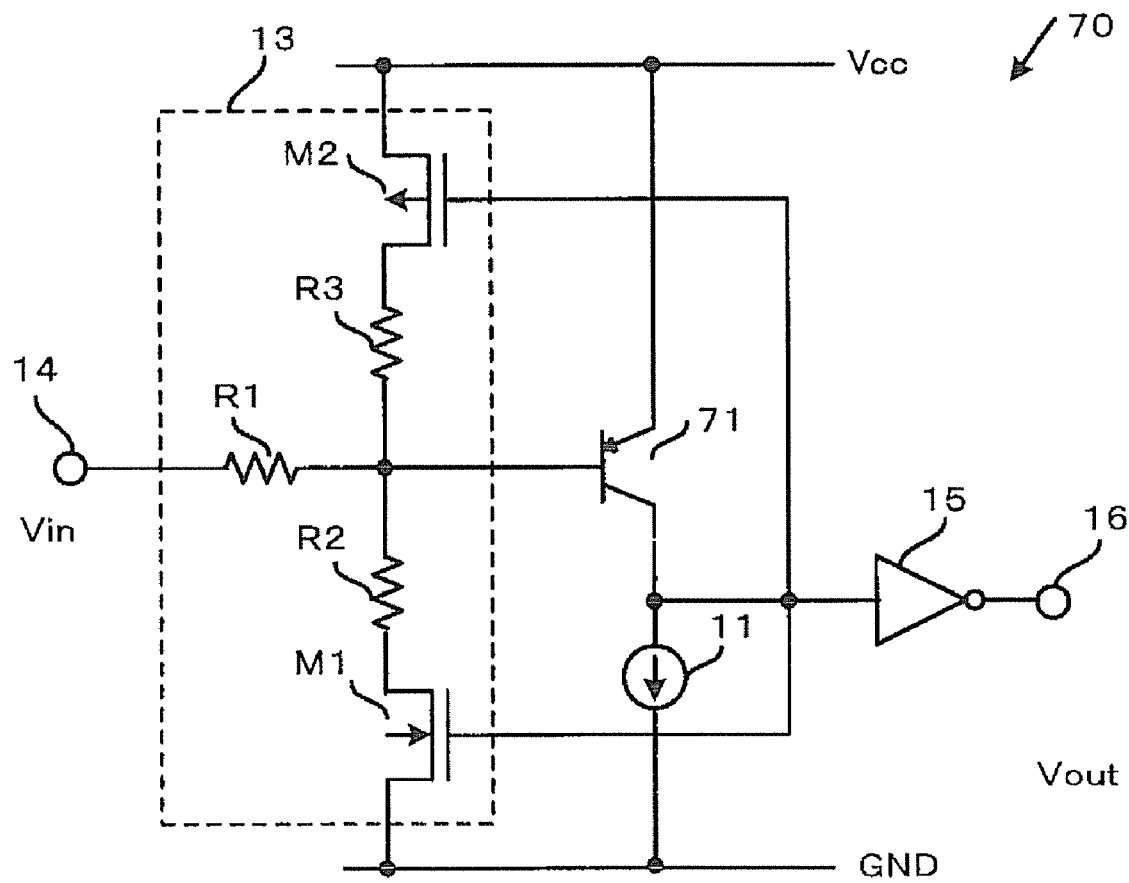
FIG. 7 is a circuit diagram showing a switching circuit in a third modification of the first embodiment of the present invention.
Figure 8:
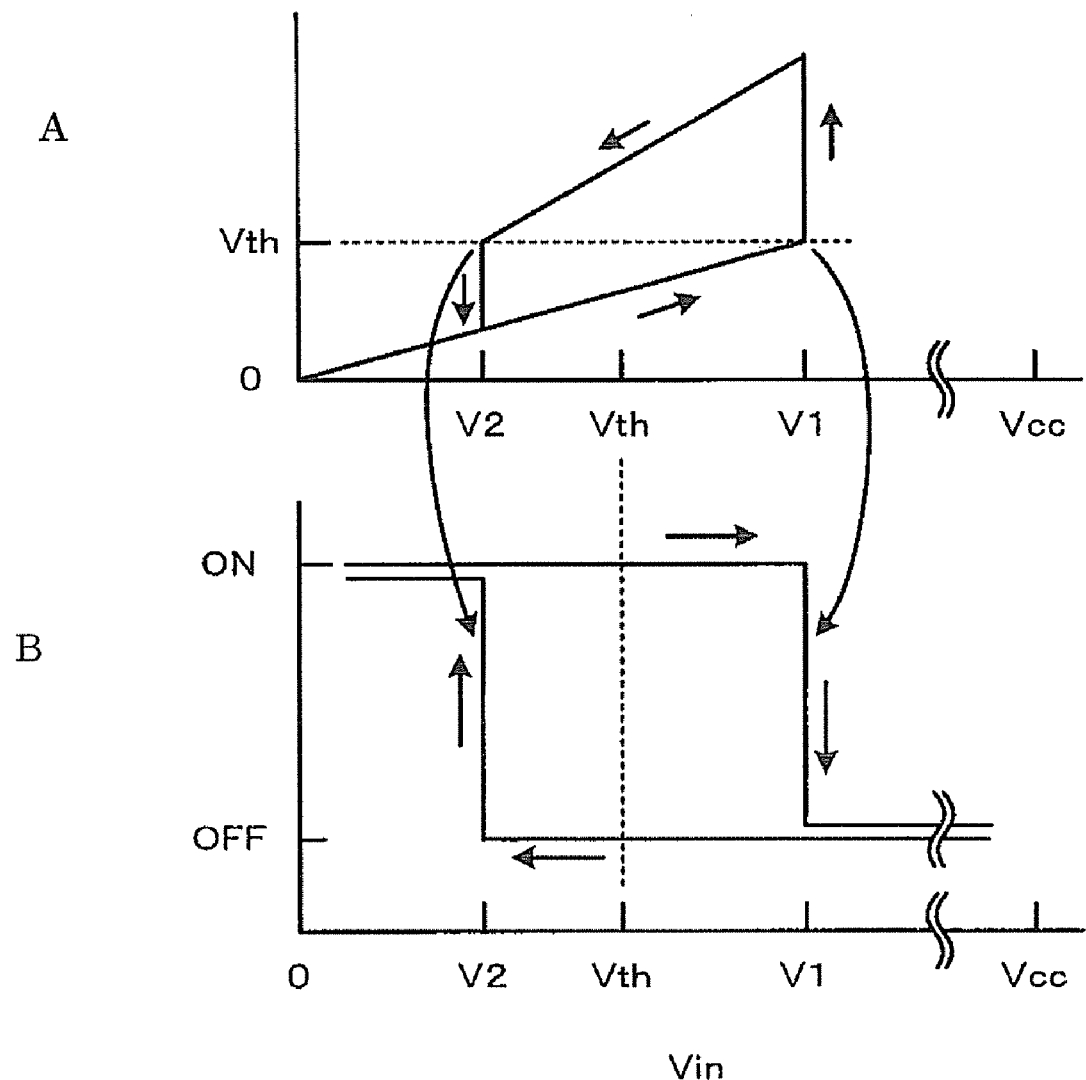
FIGS. 8A and 8B show input-output characteristic diagrams of the switching circuit, respectively, in the third modification of the first embodiment of the present invention.

For example, FIG. 7 is a circuit diagram showing a switching circuit in a third modification of the first embodiment of the present invention. FIG. 7 is a case that the transistor for switching is the pnp-bipolar transistor. FIGS. 8A and 8B show input-output characteristic diagrams of the switching circuit in the third modification of the first embodiment of the present invention.

As shown in FIG. 7, a switching circuit 70 includes a pnp-bipolar transistor 71 being called the transistor 71 hereafter. A collector as the first electrode of the transistor 71 is connected to the standard potential GND via the constant current source (load) 11 and an emitter as the second electrode is connected to the electrical source Vcc.

As shown in FIGS. 8A, 8B, the switching circuit 70 can obtain the hysteresis characteristics corresponding to the input voltage Vin being provided. In the hysteresis characteristics, the transistor 71 turns off at the first input voltage V1 higher than the threshold voltage Vth of the transistor 71 and turns on at the second input voltage V2 lower than the threshold voltage of the transistor 71.

As a result, the first input voltage V1 at which the transistor 71 turns off and the second input voltage V2 at which the transistor 71 turns on are represented by following formulas.

$$V1=(Vcc-Vth)(1+R1/R2) \quad (5)$$

$$V2=Vcc-(1+R1/R3)Vth \quad (6)$$

What is claimed is:

1. A semiconductor switching circuit with hysteresis comprising;
   a transistor, a first electrode of the transistor being connected to an electrical source via a load, a second electrode of the transistor being connected to a standard potential; and
   a driving circuit outputting a signal to a control electrode of the transistor on a basis of a potential in the first electrode of the transistor so as to turn on and off the transistor, the driving circuit turning on when an input voltage applied from an input terminal is a first voltage higher than a threshold voltage of the transistor, the driving circuit turning off when the input voltage is a second voltage lower than the threshold voltage of the transistor, wherein
   the driving circuit includes a first resistor, a second resistor, a third resistor, a first transistor and a second transistor, the first resistor being connected between the input terminal and the control electrode of the transistor, a first electrode of the first transistor being connected to the control electrode of the transistor via the second resistor, a second electrode of the first transistor being connected to the standard potential, a control electrode of the first transistor being connected to the first electrode of the transistor, the second transistor having an opposite conductive type to the first transistor, a first electrode of the second transistor being connected to the control electrode of the transistor via the third resistor, a second electrode of the second transistor being connected to the electrical source, a control electrode of the second transistor being connected to the first electrode of the transistor.

2. The semiconductor switching circuit with hysteresis according to the claim 1, further comprising:
   a fourth resistor being included in the driving circuit, the fourth resistor, the first electrode of the first transistor being connected to the control electrode of the transistor via the fourth resistor, the first electrode of the second transistor being connected to the control electrode of the transistor via the fourth resistor.

3. The semiconductor switching circuit with hysteresis according to the claim 1, wherein
   the transistor is a MOS transistor or a bipolar transistor.

4. The semiconductor switching circuit with hysteresis according to the claim 1, wherein
   a hysteresis characteristic corresponds to the input voltage of the driving circuit, the transistor turns off when the input voltage turns off, the transistor turns on when the input voltage is increased up to the first voltage and the transistor turns off when the input voltage is decreased down to the second voltage.

5. The semiconductor switching circuit with hysteresis according to the claim 1, wherein
   the load is a constant current electrical source or a resistor.

6. The semiconductor switching circuit with hysteresis according to the claim 1, further comprising;
   an inverter being located between the first electrode and the output terminal.

7. A semiconductor switching circuit with hysteresis comprising;
   a transistor, a first electrode of the transistor being connected to a standard potential via a load, a second electrode of the transistor being connected to an electrical source; and
   a driving circuit outputting a signal to a control electrode of the transistor on a basis of a potential in the first electrode of the transistor so as to turn on and off the transistor, the driving circuit turning off when an input voltage applied from an input terminal is a first voltage higher than a threshold voltage of the transistor, the driving circuit turning on when the input voltage is a second voltage lower than the threshold voltage of the transistor, wherein
   the driving circuit includes a first resistor, a second resistor, a third resistor, a first transistor and a second transistor, the first resistor being connected between the input terminal and the control electrode of the transistor, a first electrode of the first transistor being connected to the control electrode of the transistor via the second resistor, a second electrode of the first transistor being connected to the standard potential, a control electrode of the first transistor being connected to the first electrode of the transistor, the second transistor having an opposite conductive type to the first transistor, a first electrode of the second transistor being connected to the control electrode of the transistor via the third resistor, a second electrode of the second transistor being connected to the electrical source, a control electrode of the second transistor being connected to the first electrode of the transistor.

8. The semiconductor switching circuit with hysteresis according to the claim 7, further comprising:
   a fourth resistor being included in the driving circuit, the fourth resistor, the first electrode of the first transistor being connected to the control electrode of the transistor via the fourth resistor, the first electrode of the second transistor being connected to the control electrode of the transistor via the fourth resistor.

9. The semiconductor switching circuit with hysteresis according to the claim 7, wherein
   the transistor is a MOS transistor or a bipolar transistor.

10. The semiconductor switching circuit with hysteresis according to the claim 7, wherein
    a hysteresis characteristic corresponds to the input voltage of the driving circuit, the transistor turns on when the input voltage turns off, the transistor turns off when the input voltage is increased up to the first voltage and the transistor turns on when the input voltage is decreased down to the second voltage.

11. The semiconductor switching circuit with hysteresis according to the claim 7, wherein
    the load is a constant current electrical source or a resistor.

12. The semiconductor switching circuit with hysteresis according to the claim 7, further comprising;
    an inverter being located between the first electrode and the output terminal.

13. A semiconductor integrated-device comprising;
    a semiconductor substrate;

a semiconductor switching circuit with hysteresis formed on the semiconductor substrate, the semiconductor switching circuit including, a transistor, a first electrode of the transistor being connected to a electrical source via a load, a second electrode of the transistor being connected to a standard potential, a driving circuit outputting a signal to a control electrode of the transistor on a basis of a potential in the first electrode of the transistor so as to turn on and off the transistor, the driving circuit turning on when an input voltage applied from input terminal is a first voltage higher than a threshold voltage of the transistor, the driving circuit turning off when the input voltage is a second voltage lower than the threshold voltage of the transistor; and a bonding pad being connected to an input-terminal and an output-terminal of the semiconductor switching circuit, the bonding pad supplying an input received from an outer portion as an input voltage to the switching circuit, and the bonding pad supplying an output received from the semiconductor switching circuit as an output voltage to the outer portion, wherein the driving circuit includes a first resistor, a second resistor, a third resistor, a first transistor and a second transistor, the first resistor being connected between the input terminal and the control electrode of the transistor, a first electrode of the first transistor being connected to the control electrode of the transistor via the second resistor, a second electrode of the first transistor being connected to the standard potential, a control electrode of the first transistor being connected to the first electrode of the transistor, the second transistor having an opposite conductive type to the first transistor, a first electrode of the second transistor being connected to the control electrode of the transistor via the third resistor, a second electrode of the second transistor being connected to the electrical source, a control electrode of the second transistor being connected to the first electrode of the transistor.

14. The semiconductor integrated-device according to the claim 13, further comprising:

a fourth resistor being included in the driving circuit, the fourth resistor, the first electrode of the first transistor being connected to the control electrode of the transistor via the fourth resistor, the first electrode of the second transistor being connected to the control electrode of the transistor via the fourth resistor.

15. The semiconductor integrated-device according to the claim 13, wherein the transistor is a MOS transistor or a bipolar transistor.

16. The semiconductor integrated-device according to the claim 13, wherein the load is a constant current electrical source or a resistor.

17. The semiconductor integrated-device according to the claim 13, further comprising;

an inverter being located between the first electrode and the output terminal.

* * * * *